United States Patent [19]

Christiansen

[11] 3,833,838

[45] Sept. 3, 1974

[54] ELECTRONIC COMPONENT MOUNTING WAFERS FOR REPEATED CONNECTION IN A VARIETY OF CIRCUIT DESIGNS

[76] Inventor: Allan Dale Christiansen, 3034 Nestall Rd., Laguna Beach, Calif. 92651

[22] Filed: Nov. 13, 1972

[21] Appl. No.: 305,724

[52] U.S. Cl. ........... 317/101 CC, 29/626, 174/68.5, 317/261, 336/200, 338/309

[51] Int. Cl. ............................................ H05k 1/14

[58] Field of Search.... 174/68.5; 317/101 B, 101 C, 317/101 CC, 101 CM, 101 D, 261; 339/17 C; 29/625, 626, 627; 336/200; 338/309

[56] References Cited

OTHER PUBLICATIONS

"Instant Circuit Boards," Circuit-Stik, Inc., Catalog No. 501, pp. 1–5 and 8, copyright 1970, publ. by Circuit-Stik, Inc., Gardena, Calif.

*Primary Examiner*—Darrell L. Clay
*Attorney, Agent, or Firm*—Raymond L. Madsen

[57] ABSTRACT

There is disclosed a plurality of wafers, each having a multiplicity of sets of electrically conducting pads, the pads within one set being electrically connected together and electrically isolated from each of the other sets. At least one pad in each of the sets has a connecting area adapted to receive and be soldered and unsoldered repeatedly to a conductive mounting lead of an electronic component. At least another pad in each of the sets having a connecting area adapted to receive and be soldered and unsoldered repeatedly to a conductive interconnecting lead which may connect one set of conducting pads with another. Each of the sets of pads has a thickness and shape which provides an electrically conducting path of sufficient length between each pad connecting area in the set to substantially isolate from one connecting area excessive and damaging heat from soldering and unsoldering conductive leads at another connecting area.

7 Claims, 8 Drawing Figures

Figure 1A:
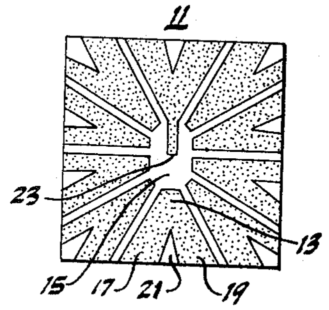

ELECTRONIC COMPONENT MOUNTING WAFERS FOR REPEATED CONNECTION IN A VARIETY OF CIRCUIT DESIGNS

The present invention relates to printed circuit "breadboard" assemblies and more particularly to printed circuit electronic component mounting wafers having heat isolated solder pads.

In the field of circuit design, it has been the general practice to assemble a temporary circuit or breadboard comprising interconnected electronic components in the desired circuit configuration determined by the designer whereby the electrical performance and functioning of the circuit may be observed and tested. Mounting boards have been used upon which components may be mounted on one side with the component mounting leads extending through drilled holes and interconnected by conductive leads, wires, and conductive strips on the other. Sometimes, a terminal is inserted through a hole drilled in the board so as to extend from one side of the board to the other, to which terminal electronic components are soldered on one side of the board and interconnecting wires or "jumpers" are connected on the other side of the board. Although such circuit breadboard and temporary assemblies have served the purpose, they have not proved entirely satisfactory under all conditions of service for the reason that considerable difficulty has been experienced in replacing or changing components in the circuit assembly and difficulties encountered in making changes in the circuit configuration and layout.

Those concerned with the design and development of electronic circuits have long recognized the need for soldering and unsoldering electronic circuit components in a changeable printed circuit assembly without damaging the components due to exposure to excessive or prolonged heat applied to their mounting leads or connecting terminals. The present invention fulfills this need.

One of the problems confronting the designers of electronic circuits using breadboard printed circuit subelements as described in U.S. Pat. No. 3,538,389 issued to Levesque et al., has been the mounting of electronic and electrical devices and components in a changeable and removable manner. It has been the practice to mount the devices on a mounting board by extending the mounting leads of the components through holes drilled through the board. The leads are then interconnected in the desired circuit configuration on the other side of the board by connecting them to subelements of printed circuits which are in turn connected together by interconnecting wires. This practice makes it difficult to replace and change components which have failed or which need to be changed in accord with the objectives of the designer such as removing devices of one type and substituting another and rearranging their configuration. The present invention overcomes this difficulty.

Another critical problem confronting designers of electronic printed circuit configurations has been the lack of a breadboard or temporary design assembly which has the electrical chracteristics approaching or simulating the final printed circuit configuration. Lead lengths, conductor spacing, distributed and stray capacitance, lead inductance and similar electrical properties have been significantly different between the breadboard assembly and the final printed circuit configuration. The present invention provides a universal set of circuit component mounting wafers having patterns of printed circuit solder paths and connecting leads which allow the designer to control component location and interconnecting links of conductive wires and leads to simulate and substantially duplicate the final printed circuit layout and configuration. Heat isolated solder pads are provided to enable the designer to assemble, reassemble and disassemble any desired circuit configuration a repeated number of times without subjecting any of the circuit components to excessive heat associated with the soldering and unsoldering of the conductive leads in the circuit.

The general purpose of this invention is to provide a printed circuit breadboard assembly which embraces all the advantages of similarly employed component mounting board and interconnecting circuit subassemblies and possesses none of the aforedescribed disadvantages. To obtain this, the present invention contemplates a unique electronic component mounting wafer and heat isolated solder pad arrangement whereby the inability to duplicate final layout configuration, to solder and unsolder circuit components repeatedly and to change the circuit configuration from one layout to another are avoided.

An object of the present invention is the provision of a circuit breadboard assembly which may be assembled and disassembled repeatedly without damage to the electronic components connected therein.

Another object is to provide an electronic component mounting structure having heat isolated solder areas whereby the components may be soldered and unsoldered repeatedly in a variety of circuit configurations without being exposed to excessive heat and damaging temperatures.

A further object of the invention is the provision of a universal printed circuit breadboard assembly having electronic component subelements which may be connected and disconnected repeatedly by soldering and unsoldering at heat isolated connected areas without exposing the components to excessive heat.

Still another object is to provide a printed circuit wafer having a plurality of sets of electrically connected printed circuit solder areas which are heat isolated one from the other.

Figures 2, 3:
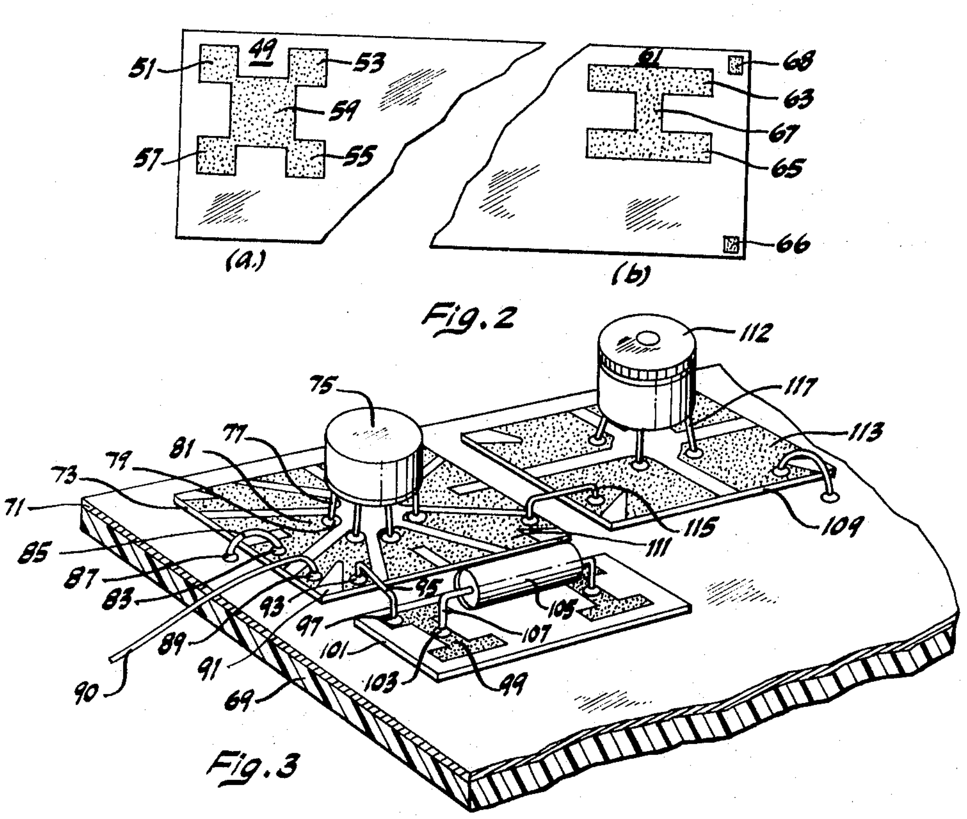
Figure 4A:
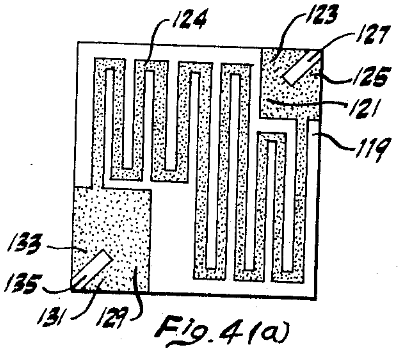

Other objects and many of the attendant advantages of this invention will be readily appreciated as the same becomes better understood by reference to the following detailed description when considered in connection with the accompanying drawings and wherein:

FIGS. 1(*a*), 1(*b*), and 1(*c*) illustrate three geometrical configurations of electronic component mounting wafers having a preferred embodiment of the heat isolated solder areas and mounting pads of the present invention;

FIGS. 2(a) and (b) illustrate sections of mounting wafers having alternate forms of sets of heat isolated mounting and connecting pads;

FIG. 3 shows a pictorial view of a section of a breadboard assembly illustrating the mounted components on their respective wafers attached to a main or supporting base member board and interconnected with soldered conductive leads; and FIGS. 4(a) and (b) illustrate inductive and capacitive wafer elements respectively, having heat isolated solder pad connecting areas.

Referring now to the drawings, there is shown in FIG. 1(a) an electronic component mounting wafer 11 having a plurality of pie-shaped conductive areas 13 arranged symmetrically around a circular nonconductive open area 15 centrally located on wafer 11. Conductive area 13 has a set of pads 17 and 18 containing solder connecting areas separated by nonconducting slot 21. It is important to note that any number of pie-shaped conducting areas may be arranged around the circular central non-conducting area 15 of the wafer as desired. One of the pie-shaped conducting areas may have a conducting element extending from its apex into the central non-conducting region 15 to provide an indexing marker as well as capacitive isolation between conducting areas adjacent to that element.

Figure 1B:
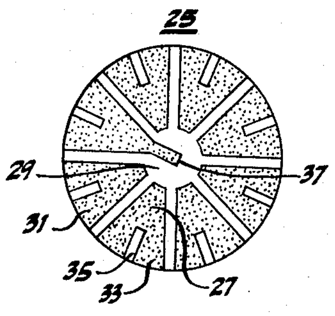

FIG. 1(b) shows a circular mounting wafer 25 having a plurality of conducting areas 27. Each conducting area 27 had pad areas 31 and 33 for making solder connections separated by slot 35 extending from the base of pie-shaped element 27 into the interior thereof. The apex of each conducting area 27 terminates at the edge of a non-conducting circuit region 29 centrally located on wafer 25. Similarly to wafer 11, one of the conducting areas 27 may have a tab extending from the apex thereof into the non-conducting circular region 29 to provide an index reference as well as capacitive isolation between the conducting areas adjacent thereto.

Figure 1C:
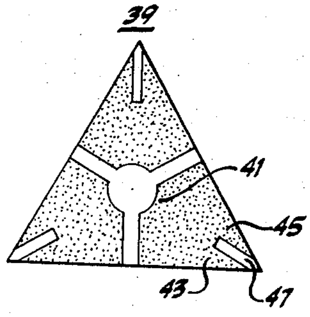

FIG. 1(c) illustrates a triangular-shaped wafer 39 having three conductive areas 41 symmetrically located thereon, each conducting area 41 having pad areas 43 and 45 separated by non-conducting slot 47 partially extending from the corner of the triangular wafer into the interior of conducting area 41.

FIG. 2(a) illustrates a top view of a section of a rectangular wafer showing a conducting area 49 comprising rectangular elements 51, 53, 55, and 57 interconnected by rectangular area 59 which intersects a corner of each of the other four rectangular areas.

FIG. 2(b) shows a top view of a section of a rectangular wafer having a conducting area 61 thereon comprising rectangular areas 63 and 65 interconnected by a rectangular area 67 joining the respective centers of areas 63 and 65 in the form of the letter "I". Tie-down areas 66 and 68 are conductive segments to which mechanical support wires may be fastened to secure the wafer to a base mounting board.

FIG. 3 illustrates a pictorial view of base mounting board 69 having a conductive sheet 71 attached to one side thereof and to which is attached component mounting wafer 73 having cylindrical integrated circuit component 75 mounted thereon. Component 75 is attached to wafer 73 by having the mounting leads thereof soldered to conductive areas on wafer 73 as illustrated by mounting lead 77 extending from integrated circuit 75 to solder area 79 at the apex of conductive area 81. One of the pad areas of conductive area 81 has a solder area 83 connected by connecting wire 85 to solder area 87 located on conductive surface 71 of base mounting board 69. It is to be noted that the individual circuit mounting wafers may be connected to the base mounting board by soldering connecting leads therebetween such as wire 85, or an adhesive may be applied to each component wafer to adhesively connect the wafer to base mounting board 69. Although FIG. 3 shows wire 85 as a circuit connection for mounting the wafer, it should be understood that tie-down areas such as 66 and 68 in FIG. 2(b) may be used to fasten wafers to the base mounting board or to each other for mechanical support separate from the electrical circuit connections. Another connecting area adjacent area 81 shows non-conducting slot 91 separating solder areas 89 and 93 to which conductive wires 90 and 95 are connected, respectively. Connecting wire 90 is shown unconnected at the other end as might typically be the case if it were to be connected to a source of power or to a test instrument. Connecting wire 95 is connected to solder area 97 of conductive area 99 having the I shape illustrated in FIG. 2(b). Conductive area 99 in turn is attached to the surface of component mounting wafer 101. The central portion of conducting area 99 further contains solder area 103 to which the mounting lead 107 of electronic component 105 is attached.

Another component mounting wafer 109 has a conductive area 113 which is connected to conductive area 111 on wafer 73 by soldering the end of interconnecting wire 115 respectively thereto. Miniature potentiometer 112 is also connected to conductive area 113 and other conducting areas provided on mounting wafer 109, conductive area 113 being soldered to mounting lead 117 of potentiometer 112.

FIG. 4(a) illustrates an inductive reactance wafer 199 having a conductive area 121 on which are located solder pad connecting areas 125 and 123 separated by non-conducting slot 127. A "serpentine" conducting lead 124 is connected from conductive area 121 to conductive area 129 which in turn has a solder pad connecting areas 131 and 133 separated by non-conducting slot 135.

Figure 4B:
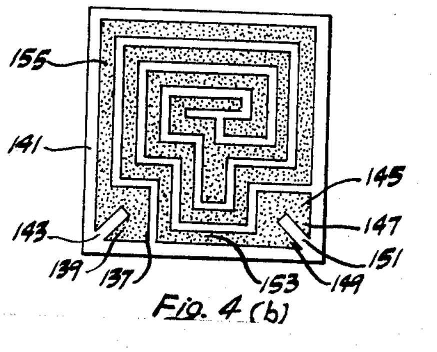

FIG. 4(b) illustrates a capacitive reactance wafer having conducting area 137 with solder pad connecting areas 139 at 141 separated by non-conducting slot 143. Conductive area 137 is connected to a thin conducting strip 155 which runs adjacent but it not electrically connected to another thin conducting strip 153. Strip 153 is connected to conductive area 145 having solder connecting pad areas 147 and 149 thereon separated by non-conducting slot 151.

Operation of the invention can best be understood by turning to the breadboard circuit assembly pictorially illustrated in FIG. 3. Integrated circuit components 75 can be soldered to the conductive area on mounting wafer 73 by cutting the mounting leads of integrated circuit 75 to a desired length and soldering each lead to the respective apex of the conducting areas provided on mounting wafer 73. The number of conducting areas thus provided is in accord with the number of leads associated with integrated circuit 75. An alternate method of connecting integrated circuit 75 to the conducting areas on mounting wafer 73 is to drill holes through the apex of each conducting area and pass the mounting leads of integrated circuit 75 partially thereinto and soldering the leads. In this latter method it is important not to extend the leads all the way through the holes since, if a base mounting board having a conducting surface is used to mount the wafers, there is the possibility of making electrical contact with the conducting surface. It is important to note that base mounting boards without conducting surfaces may be used to mount the electronic component mounting wafers where the circuit does not require a conductive groundplane. Mounting board 73 with integrated circuit 75 electrically soldered thereto can then be attached into any circuit configuration as desired by the circuit designer. As illustrated in FIG. 3, one conducting area is shown further soldered to connecting wire 90 and interconnecting wire 94. Wire 90 can be soldered to solder area 89 without affecting the solder connection at solder area 93 to connecting wire 95, because non-conducting slot 91 and the thinness of the conducting material prevent the heat from being directly conducted from solder area 89 to solder area 93 and vice versa by providing an elongated path of small cross-sectional area.

The conductive areas on mounting wafer 73 are pie-shaped and thin and therefore provide a long heat conducting path of small cross-sectional areas between the solder areas for the connecting wires and the apex solder area connected to a mounting lead of integrated circuit 75. Therefore, heat isolation is further provided between the solder area of the mounting lead of the integrated circuit and the solder areas for the interconnecting wires.

It should be clear to the circuit designer that the size and shape of the component mounting wafer can be selected to meet any particular circuit design and configuration. A kit of a variety of mounting wafer sizes, shapes, and conducting areas can be provided to the designer whereby any electronic circuit component may be mounted and interconnected with other components in a wide variety of circuit configurations. In addition, it is possible for the designer to lay out the location of circuit components in a manner which can directly simulate or duplicate a final circuit design or printed circuit layout. Therefore, changes in electrical performance and function between the breadboard circuit configuration and the final printed circuit assembly can be minimized.

Turning now to FIG. 1, conductive area 13 on component mounting wafer 11 is divided by non-conducting slot 21. Similarly conductive area 27 on component mounting wafer 25 is divided by slot 35 and conducting area 41 on component mounting wafer 39 is divided by slot 47. Each solder pad connecting area in the sets of pads 17–19, 31–33, and 43–45 on the respective wafers are therefore isolated from one another to prevent heat introduced at one pad from being transmitted directly to the other pad in the set. Wires can be soldered or "tacked" to a solder pad without the wires attached to the adjacent pad being loosened by the heat applied. The mounting wafers can be used over and over by removing the solder by well known "wicking" methods and by reapplying adhesive where adhesive is used to attach the wafer to the base mounting board.

The divided or separated solder pads of each conductive area or pad set on the mounting wafers are extremely effective in protecting delicate electronic components such as integrated circuits. This is particularly useful in the educational field where laboratory circuits are repeatedly assembled and disassembled resulting in the repeated soldering and unsoldering of integrated circuit devices in a variety of circuit configurations. As a result the circuit mounting wafer can be removed and inserted in another circuit repeatedly without heat damage to the component.

When the mounting wafers are attached to a base mounting board which has a conducting surface 71 as illustrated in FIG. 3, a ground plane is formed to provide a low impedance circuit ground as well as minimum of inductive and capactive coupling between adjacent circuits at very high frequencies. Because of the ground plane and the ability to minimize lead length and to arrange and rearrange the circuit components in their best physical and electrical relation, the greatest advantage of the gain-bandwidth product of active components in the circuit can be achieved.

As illustrated in FIG. 3, a multiplicity of wafers may be interconnected to form a desired circuit configuration. Wafers may be repeated in a "chain-like" connection of modular sections to form any circuit configuration. It is not necessary that the wafers be mounted on a base mounting board if a ground plane is not required. Thus, a modular circuit assembly is provided having an unlimited number of circuit configurations and layouts.

It is important to note that the breadboard component mounting wafers are readily adapted to distributed reactance components such as transmission lines and striplines.

Turning to FIG. 2(a), it should be clear that the set of conducting pads 49 provide ideal heat isolation from one solder connecting pad to the other. For example, it should be clear that solder connecting pad 51 is isolated from solder connecting pad 55 by the long diagonal path across conductive area 59 and the thinness of the conductive material. Similarly solder connecting pad 53 is isolated from solder connecting pad 57 by the other diagonal path across conducting area 59. Furthermore solder connecting pad 51 is isolated from solder connecting pad area 57 by width of the conducting area 59 as is solder connecting area 53 from solder connecting area 55.

In FIG. 2(b) it should be evident that the extremities of solder connecting area 63 and solder connecting area 65 are heat isolated one from another by the length and thinness of conductive area 67. The extremities of each of the conducting areas 63 and 65 also are heat isolated from one another by the length and thinness of their respective areas.

It now should be apparent that the present invention provides a breadboard circuit arrangement which may be employed in conjunction with the design of circuit where electronic circuit components are soldered and unsoldered repeatedly in a variety of circuit configurations, whereby the components are protected from exposure to heat and high temperature resulting from the soldering and unsoldering process.

Although particular components, etc., have been discussed in connection with the specific embodiment of heat isolating component mounting wafers constructed in accordance with the teachings of the present invention, others may be utilized. Furthermore, it will be understood that although an exemplary embodiment of the present invention has been disclosed and discussed, other applications and circuit arrangements are possible and that the embodiments disclosed may be subjected to various changes, modifications and substitutions without necessarily departing from the spirit of the invention.

What is claimed is:

1. Apparatus for changeably interconnecting a multiplicity of electronic components in a plurality of different circuit configurations comprising:

a wafer having a multiplicity of electrically conducting areas, each area having a non-conducting slot therein to form connecting pads which are separated and divided apart to receive and be soldered and unsoldered repeatedly to a conductive interconnecting lead, each of said conducting areas having at least one other connecting pad adapted to receive and be soldered and unsoldered repeatedly to a conductive mounting lead of an electronic component, each of said conducting areas having a shape and thickness which provides an electrically conducting path between each connecting pad of sufficient length and small cross-sectional area to substantially isolate from one connecting pad excessive and damaging heat from soldering and unsoldering at another connecting pad.

2. The apparatus described in claim 1 further including a plurality of said wafers and a base member having a surface thereon to which said plurality of said wafers are removeably attached and supported, said wafers being electrically interconnected in a predetermined configuration to form one of a plurality of different electronic circuit configurations, said base member having a ground plane of electrically conductive material attached to said surface to form a convenient low impedance circuit ground, said plurality of said wafers having a substantial thickness to minimize the capacitance between said conducting areas on said wafers and said ground plane of said base member.

3. The apparatus described in claim 2 wherein at least one of said plurality of said wafers comprises:

a substantially flat non-conducting substrate upon one surface of which said conducting areas are fixedly secured in the form of a multiplicity of substantially pie-shaped areas, each area being a thin sheet of electrically conducting material which is electrically isolated from the other areas, the apex region of each of said substantially pie-shaped areas being a connecting pad area particularly suited to be soldered and unsoldered repeatedly to wire conductors of an electronic component, each of said substantially pie-shaped areas having said non-conductive slot located along a line extending from the edge of the base thereof to the interior of the area whereby the base region is divided into two pad connecting areas to each of which a conductive lead may be soldered and unsoldered repeatedly without adversely affecting a soldered connection at the other, said pie-shaped area being constructed to have a large ratio of surface area to cross section area and a substantial distance between the apex and base regions to dissipate heat and prevent damage to the electronic components fastened to the apex pad, whereby said wafer and its electronic component repeatedly can be soldered to and unsoldered from a multiplicity of different circuit configurations.

4. The apparatus described in claim 3 further including a circuit region centered on said wafer, said apex regions of each of said substantially pie-shaped areas being uniformly located around the circumference of said circular region and further including one apex region of a selected substantially pie-shaped area having a tab of conductive material extending into said circular region to provide an index marker and capacitive isolation between the areas immediately adjacent said selected area.

5. The apparatus described in claim 2 wherein at least one of said plurality of said wafers comprises a substantially flat non-conducting substrate and wherein said conducting areas comprise a pair of parallel rectangular areas of thin conducting material joined together at the midpoint of the nearest parallel edges of a third rectangular region of thin conducting material, said non-conducting slot being located between said nearest parallel edges and the edges of said third rectangular region the most distant end regions of each of said parallel rectangular areas forming connecting pad areas to which conducting leads may be repeatedly soldered and unsoldered.

6. The apparatus described in claim 2 wherein at least one of said plurality of said wafers comprises a substantially flat non-conducting substrate and wherein said conducting areas comprise a plurality of four rectangular connecting pads of thin conductive material joined by a fifth area of rectangular conductive material which overlaps a corner of each of the other four rectangular pads, said non-conducting slot being located between each pair of adjacent edges of two adjacent pads of said four rectangular connecting pads and the intersecting edge of said fifth area, said four rectangular connecting pads being particularly suited to the repeated soldering and unsoldering of conductive wires and component leads.

7. The apparatus described in claim 1 wherein at least one of said plurality of wafers comprises a substantially flat non-conducting substrate and wherein said conducting areas are thin sheets of electrically conducting material fixedly secured to one surface of said substrate adjacent two perpendicular straight lines passing through the center of said substrate to form four electrically isolated conductive sets of pads, the portions of said sets most centrally located on said substrate forming pads with connecting areas particularly suited to be fastened to a terminal of an electronic component, the regions of said sets adjacent the outer edges of said substrate forming pads with connecting areas separated by said non-conducting slots which areas are particularly suited to be soldered and unsoldered repeatedly to conductive interconnecting leads.

* * * * *